United States Patent
Koike et al.

(10) Patent No.: US 6,524,757 B2
(45) Date of Patent: Feb. 25, 2003

(54) COLOR FILTER AND METHOD FOR PRODUCING THE SAME

(75) Inventors: Junichiro Koike, Sakura (JP); Hisatomo Yonehara, Sakura (JP); Hiroyuki Tokuda, Sakura (JP); Yasunobu Hirota, Sakura (JP)

(73) Assignee: Dainippon Ink and Chemicals, Inc., Tokyo (JP)

( * ) Notice: Subject to any disclaimer, the term of this patent is extended or adjusted under 35 U.S.C. 154(b) by 0 days.

(21) Appl. No.: 09/901,596

(22) Filed: Jul. 11, 2001

(65) Prior Publication Data

US 2002/0025481 A1 Feb. 28, 2002

(30) Foreign Application Priority Data

Jul. 13, 2000 (JP) ........................................ 2000-212674

(51) Int. Cl.$^7$ ............................. G02B 5/20; G02F 1/1335
(52) U.S. Cl. ............................................................ 430/7
(58) Field of Search ................................................. 430/7

(56) References Cited

U.S. PATENT DOCUMENTS

| 5,789,136 A | 8/1998 | Sato et al. | 430/270.1 |
| 5,879,855 A | 3/1999 | Schädeli et al. | 430/270.1 |
| 6,048,924 A | 4/2000 | Obayashi et al. | 524/501 |

FOREIGN PATENT DOCUMENTS

| EP | 0 825 239 A | * | 8/1997 |
| EP | 0 833 203 A1 | | 4/1998 |
| EP | 0 860 473 A1 | | 8/1998 |
| JP | 8-176249 | | 7/1996 |
| JP | 8-292564 | | 11/1996 |
| JP | 9-143169 | | 6/1997 |
| JP | 9-203806 | | 8/1997 |
| JP | 9-208821 | | 8/1997 |
| JP | 10-140015 | | 5/1998 |
| JP | 10-273525 A | * | 10/1998 |
| WO | WO 99/07800 | | 2/1999 |

OTHER PUBLICATIONS

Press Journal, Inc.—"LCD Panel Element and Technology", pp. 23–25, issued on Mar. 20, 1999.

* cited by examiner

Primary Examiner—John A. McPherson
(74) Attorney, Agent, or Firm—Armstrong, Westerman & Hattori, LLP

(57) ABSTRACT

An object is to provide a color filter which is capable of forming a pattern using an alkaline developer and has excellent heat resistance, solvent resistance and chemical resistance, and is also suitable for practical use. The color filter comprises a transparent substrate and a pixel formed on the transparent substrate, wherein the pixel is made of a coating film of a curable colored composition containing (a) a coloring material, (b) a compound having a photopolymerizable functional group and (c) an amino resin having a carboxyl group and/or a phenolic hydroxyl group and the coating layer is photocured, followed by heat curing.

8 Claims, No Drawings

COLOR FILTER AND METHOD FOR PRODUCING THE SAME

BACKGROUND OF THE INVENTION

1. Field of the Invention

The present invention relates to a color filter which is used in color liquid crystal displays, color scanners and solid image pick-up elements, and, more particularly, to a color filter having excellent durability, suitable for uses which require durability after passing through the step of forming a pattern by means of exposure and development.

2. Description of Related Art

As one of the photocurable colored compositions using coloring materials such as pigments and dyes, for example, there has hitherto been known a photocurable colored composition obtained by adding a photopolymerizable monomer and a photopolymerization initiator to a colored composition in which a coloring material is dispersed by using a binder and/or a dispersant. There has also been known a method of forming a colored image by means of a method of coating the photocurable colored composition to a substrate, drying the photocurable colored composition, exposing the coated substrate to light through a mask, developing to form a colored pattern, and fixing the colored pattern by baking. One of industrial applications of these photocurable colored compositions include, for example, a color filter used in color liquid crystal displays, color scanners and solid image pick-up elements. The color filter is formed by arranging coloring materials on each pixel to selectively transmit the three primary colors (red, green, and blue) of light or to selectively reflect the three primary colors (cyan, magenta, and yellow) of color, on a transparent substrate provided with a black matrix.

Characteristics required of materials for color filters often originate in the process of manufacturing color liquid crystal displays, and examples thereof include heat resistance required in the deposition or sputtering processes of a transparent electrode and baking process of a color filter, and solvent resistance required in the cleaning and alignment film coating processes. Furthermore, light resistance is also required because light transmitted through the color filter becomes image information during the display of the image.

To meet these requirements, pigments have mainly been used as the coloring material. As the manufacturing method, for example, a "pigment dispersion method" has popularly been used (LCD Panel Elements and Technology, pp. 23–25, Press Journal Inc., issued on Mar. 20, 1999). Acrylic binder resins having comparatively superior heat resistance, light resistance, transparency, and chemical resistance have mainly been used as the binder resin in the method.

As the developer used in the development process after the exposure process in the processes of manufacturing a color filter by means of the "pigment dispersion method", an aqueous alkaline solution is more preferable than an organic solvent in view of environmental problems. To impart the development aptitude in an aqueous alkaline solution to a photocurable colored composition, the solubility to alkaline solution is also required of the binder resin used to disperse the pigment, and an acrylic binder resin having a carboxyl group is generally used as an alkaline developing type photocurable colored composition.

However, the acrylic resin having a carboxyl group had a drawback in that it is liable to be decomposed when the temperature exceeds 200° C.

For the purpose of overcoming the drawback, a resist material comprising an alkali-soluble resin, a photo acid generator, and a melamine resin (Japanese Patent Application, First Publication No. Hei 8-292564) and a negative type-photosensitive composition for a color filter, comprising an acrylic resin having a carboxyl group, a photo acid generator, and a crosslinking agent capable of curing by an action of the acid (Japanese Patent Application, First Publication No. Hei 9-203806) are disclosed.

In these substances, the melamine resin is crosslinked by an action of an acid generated from the photo acid generator under light irradiation and is to be insoluble in an alkaline developer, thereby making it possible to form a pattern.

When using the photo acid generator, however, the acid attributable to the photo acid generator remains in the color filter, thereby causing deterioration of the color filter, or causing diffusion of the acid into a liquid crystal, resulting in increasing of the conductivity of the liquid crystal. Therefore, it is not preferred.

It has been required to develop a color filter, which has excellent heat resistance and does not cause color change due to heat during post-baking, with the increase of the temperature during the deposition of a transparent electrode, sputtering or baking after the development.

Under these circumstances, it is required to develop a color filter, which has both physical properties of the coating (e.g., good heat resistance and solvent resistance) and alkali developing properties, and is free from residual impurities that causes degradation of the liquid crystal.

BRIEF SUMMARY OF THE INVENTION

An object of the present invention is to provide a color filter which is capable of forming a pattern using an alkaline developer and has excellent heat resistance, solvent resistance, and chemical resistance, especially heat resistance, and is also suitable for practical use.

To attain the object described above, the present invention provides a color filter comprising a transparent substrate and a pixel formed on the transparent substrate, wherein the pixel is made of a coating layer of a curable colored composition containing (a) a coloring material, (b) a compound having a photopolymerizable functional group, and (c) an amino resin having a carboxyl group and/or a phenolic hydroxyl group and the coating layer is photocured, followed by heat curing.

To attain the object described above, the present invention also provides a method for producing a color filter, which comprises forming a coating layer on a transparent substrate using a curable colored composition containing (a) a coloring material, (b) a compound having a photopolymerizable functional group, and (c) an amino resin having a carboxyl group and/or a phenolic hydroxyl group, exposing the coating layer to light via a mask having a pixel pattern for a color filter, thereby curing the coating, developing the coating to form a pixel, and heating the pixel, thereby heat-curing the pixel.

Since the color filter of the present invention contains, as an alkali-soluble binder resin, an amino resin having a carboxyl group or a phenolic hydroxyl group, the resulting coating film has an excellent capability of forming a pattern using an alkaline developer. According to the method for producing a color filter of the present invention, since a photopolymerizable colored resin composition containing a compound having a photopolymerizable functional group is used, the resulting coating is photopolymerized by means of photolithography, thus making it possible to form a pixel having excellent heat resistance, solvent resistance, and chemical resistance and to provide a color filter suitable for practical use.

DETAILED DESCRIPTION OF THE INVENTION

The present invention will now be described in more detail.

The transparent substrate used in the present invention is a transparent substrate which is used in the color filter and has enough heat resistance to endure heat curing. Such a transparent substrate is, for example, a glass substrate.

As the coloring material (a) used in the present invention, for example, dyes and pigments used usually in the color filter can be used without any problem, but pigments are preferably used in view of heat resistance and light resistance.

The average particle diameter of the pigment is preferably within a range from 0.005 to 3 µm, and more preferably from 0.01 to 1 µm. When the average particle diameter is smaller than the above range, thixotropy is liable to appear, and therefore, good applicability cannot be obtained. On the other hand, when the average particle diameter is larger than the above range, the resulting coating has poor transparency. To obtain the average particle diameter within the above range, a dispersion treatment using a ball mill, sand mill, bead mill, three-roll, paint shaker, atliter, dispersion stirrer, and ultrasonic waves is effective.

The compound (b) having a photopolymerizable functional group used in the present invention is a compound having a functional group capable of polymerizing or crosslinking by means of irradiation with ultraviolet light or visible light, and typical examples thereof include radical polymerizable compounds and cation polymerizable compounds.

Specific examples thereof include (meth)acrylic compound and maleimide compound. Specific examples of these compounds include, but are not limited to, the following:

(meth)acrylic compounds used as the compound (b) having a photopolymerizable functional group, for example, timethylolethane tri(meth)acrylate, timethylolpropane tri(meth)acrylate, timethylolpropane di(meth)acrylate, neopentyl glycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth)acrylate, trimethylolpropane tri(acryloyloxypropyl) ether, tri(acryloyloxyethyl) isocyanurate, tri(acryloyloxyethyl) cyanurate, and glycerin tri(meth)acrylate; reaction products of epoxy resin and (meth)acrylic acid, such as phenol-novolak type epoxy resin, cresol-novolak type epoxy resin, and bisphenol A type epoxy resin; and reaction products of polyols (e.g., ethylene glycol, polyethylene glycol, polypropylene glycol, polytetramethylene glycol, polyethoxydiol of bisphenol A, polyesterpolyol, polybutadienediol, polycarbonate polyol, etc.), organic polyisocyanates (e.g., tolylene diisocyanate, xylene diisocyanate, isophorone diisocyanate, hexamethylene diisocyanate, etc.) and hydroxyl group containing (meth)acrylates (e.g., 2-hydroxyethyl (meth)acrylate, 2-hydroxypropyl (meth)acrylate, 1,4-butanediol mono (meth)acrylate; and maleimide compounds used as the compound (b) having a photopolymerizable functional group, preferably compounds wherein a maledimide group is bonded through an aliphatic group, for example, alkyl or alkyl ether maleimide such as N-hexyl maleimide or N,N'-4,9-dioxa-1,12-bismaleimidedecane, maleimidecarboxylic acid (poly)alkylene glycol ester such as ethylene glycol bis(maleimide acetate), poly(tetramethylene glycol) bis(maleimide acetate) or tetra(ethylene glycol modified) pentaerythritol tetra(maleimide acetate), carbonate maleimide such as bis(2-maleimideethyl) carbonate, and urethane maleimide such as isophoronebisurethanebis(N-ethylmaleimide).

Among these compounds, polyfunctional (meth)acrylates and polyfunctional maleimides, such as trimethylolpropane tri(meth)acrylate, pentaerythritol tetra(meth)acrylate, dipentaerythritol hexa(meth)acrylate, dipentaerythritol penta(meth)acrylate, N,N'-4,9-dioxa-1,12-bismaleimidedecane, ethylene glycol bis(maleimdie acetate), poly(tetramethylene glycol) bis(maleimide acetate), (ethylene glycol modified) pentaerythritol tetra(maleimide acetate), bis(2-maleimideethyl) carbonate and isophoronebisurethanebis (N-ethylmaleimide) are particularly preferred in view of curing in the irradiation with ultraviolet light or visible light.

The compounds (b) having a photopolymerizable functional group may be used alone or in combination, and the amount is not specifically limited, but is preferably from 25 to 150% by weight based on the total amount of the binder resin containing an amino resin (c) used in the polymerizable colored composition. When the amount exceeds 150% by weight, the desired solubility to alkaline solution of the present invention is lowered. On the other hand, when the amount is lower than 25% by weight, it becomes difficult to obtain a cured coating having desired physical properties of the coating and to form a pattern. Therefore, it is not preferred.

The amino resin (c) used in the present invention can be obtained by condensing an amino compound such as urea, melamine, benzoguanamine, acetoguanamine or guanamine compound with an aldehyde compound such as formaldehyde, paraformaldehyde or acetoaldehyde. It can also be obtained by etherifying the condensed compound with an alcohol for etherification.

Examples of the amino compound used in the present invention include, but are not limited to, urea, melamine, benzoguanamine, acetoguanamine, cyclohexanecarboguanamine, phthaloguanamine, steroguanamine, spiroguanamine, 2-, 3- or 4-(4,6-diamino-1,3,5-triazin-2-yl)benzoic acid, and 2-, 3- or 4-(4,6-diamino-1,3,5-triazin-2-yl)-phenol.

Among these amino compounds, melamine, benzoguanamine or (4,6-diamino-1,3,5-triazin-2-yl)benzoic acid is particularly preferred in view of developing properties and heat resistance.

Examples of the aldehyde compound include, but are not limited to, formaldehyde, paraformaldehyde, acetaldehyde, propionaldehyde, butylaldehyde, glyoxazol, glyoxylic acid, succinsemialdehyde, or 2-, 3- or 4-hydroxybenzaldehyde; formaldehyde condensates such as trioxane or paraformaldehyde; aqueous solutions such as aqueous formaldehyde solution; and methylhemiformal, n-butylhemiformal or isobutylhemiformal.

Among these aldehyde compounds, formaldehyde, glyoxylic acid, siccinsemialdehyde or 4-hydroxybenzaldehyde is particularly preferred in view of developing properties and heat resistance. These aldehyde compounds may be used alone or in combination, as a matter of course.

Since the amino resin (c) used in the present invention has a feature that it has a carboxyl group and/or a phenolic hydroxyl group, in the case of a raw amino compound for amino resin, having neither a carboxyl group nor a phenolic hydroxyl group is, for example, urea, melamine, benzoguanamine, acetoguanamine, cyclohexanecarboguanamine, phthaloguanamine, steroguanamine or spiroguanamine, the aldehyde compound to be used essentially has at least a carboxyl group or a phenolic hydroxyl group. The aldehyde compound is preferably glyoxylic acid, succinsemialdehyde, or 2-, 3- or 4-hydroxybenzaldehyde.

In the case of an amino compound as a raw material of the amino acid resin (c) has a carboxyl group or a phenolic hydroxyl group, such as 2-, 3- or 4-(4,6-diamino-1,3,5-triazin-2-yl)benzoic acid and 2-, 3- or 4-(4,6-diamino-1,3,5-triazin-2-yl)-phenol, the aldehyde compound to be used is not specifically limited and the compounds listed above can be used.

The amino resin (c) used in the present invention is not only by condensing one amino compound with one aldehyde compound, but also by condensing a combination of these compounds. In this case, at least one of the amino compounds and the aldehyde compounds may have at least one carboxyl group or phenolic hydroxyl group. For example, a mixture obtained by mixing benzoguanaine with 4-(4,6-diamino-1,3,5-trizin-2-yl)benzoic acid in a desired proportion can also be condensed with formaldehyde or a mixture obtained by mixing formaldehyde with glyoxylic acid in a desired proportion. An acid value of the resulting amino resin can be adjusted by using a plurality of the amino compounds and/or aldehyde compounds as the raw material, thereby making it control the developing properties of the photocurable colored composition.

In the present invention, the alcohol for etherification is mainly useful to stabilize the condensation reaction product made from the amino compound and the aldehyde compound as the raw material. Examples thereof include, but are not limited to, various alcohols having 1 to 8 carbon atoms such as methanol, ethanol, n-propanol, isopropanol, n-butanol, isobutanol, sec-butanol, tert-butanol, cyclohexanol, n-pentanol, isopentanol, methylisobutyl carbinol, benzyl alcohol, furfuryl alcohol, n-octanol, sec-octanol, 2-ethylhexyl alcohol, and allyl alcohol; various ether alcohols such as ethylene glycol monomethyl ether, ethylene glycol monoethyl ether, ethylene glycol monobutyl ether, ethylene glycol monoisobutyl ether, ethylene glycol mono-tert-butyl ether, ethylene glycol mono-iso-propyl ether, ethylene glycol monohexyl ether, 3-methoxybutanol, 3-methyl-3-methoxybutanol, diethylene glycol monomethyl ether, diethylene glycol monoethyl ether, diethylene glycol monombutyl ether, propylene glycol monomethyl ether, and dipropylene glycol monomethyl ether; and various ketone alcohols such as ketobutanol, diacetone alcohol, and acetoin. These alcohols may be used alone or in combination, as a matter of course.

Among these alcohols, methanol, ethanol, n-propanol, isopropanol, n-butanol and isobutanol are particularly preferred in view of the reactivity, cost, and crosslinking properties of the resulting amino resin.

To obtain the amino resin (c) used in the present invention, for example, 1.0 mol of the amino compound, 1.5 to 8 mol of the aldehyde compound, and 3 to 20 mol of the alcohol for etherification may be reacted with each other according to the method described in Japanese Patent Application, First Publication No. Hei 9-143169, Japanese Patent Application, First Publication No. Hei 8-176249, Japanese Patent Application, First Publication No. Hei 9-208821 or Japanese Patent Application, First Publication No. Hei 10-140015. In the reaction, a conventionally known solvent can be used.

When using two or more amino compounds and/or aldehyde compounds as the raw material for amino resin (c) in combination, the proportion is not specifically limited. When the acid value is too small, the resulting amino resin has poor solubility to alkaline solution. On the other hand, when the acid value is too large, the solubility to alkaline solution is also enhanced to suppress the solubility to alkaline solution even if the compound (b) having a photopolymerizable functional group is cured by irradiation with ultraviolet light or visible light. Accordingly, the composition is preferably adjusted so that the acid value of the amino resin (c) is within a range from 20 to 250 mg KOH/g.

To prepare the amino resin (c), various conventionally known methods can be employed. Examples thereof include:

(1) a method of adding an amino compound to a solution prepared by adding an aldehyde compound to an alcohol for etherification, and reacting the mixed solution at a temperature of 50 to 140° C. for 20 minutes to 7 hours, if necessary, in the presence of an acidic catalyst, thereby simultaneously carrying out the condensation reaction and etherification reaction, (2) a method of methylolating a solution containing an aldehyde compound and an amino compound at a pH within a range from 8 to 10, and carrying out the alkyl etherification reaction at a pH within a range from 2 to 6 in the presence of an alcohol for etherification, (3) a method of adding at least one amino compound selected from the group consisting of urea, melamine, benzoguanamine, acetoguanamine, cyclohexanecarboguanamine, phthaloguanamine, steroguanamine and spiroguanamine to a solution prepared by adding an aldehyde compound to an alcohol for etherification, and adding (4,6-diamino-1,3,5-triazin-2-yl) benzoic acid and/or (4,6-diamino-1,3,5-triazin-2-yl)-phenol during the condensation reaction and etherification reaction, and (4) a method of adding at least one aldehyde compound selected from the group consisting of formaldehyde, paraformaldehyde, acetaldehyde, propionaldehyde, butylaldehyde, glyoxazol, glyoxylic acid, succinsemialdehyde, and 2-, 3- or 4-hydroxybenzaldehyde to an alcohol for etherification, and adding at least one amino compound selected from the group consisting of urea, melamine, benzoguanamine, acetoguanamine, cyclohexanecarboguanamine, phthaloguanamine, steroguanamine, spiroguanamine, (4,6-diamino-1,3,5-triazin-2-yl)benzoic acid and (4,6-diamino-1,3,5-triazin-2-yl)-phenol, thereby carrying out the condensation reaction and etherification reaction.

It is also possible to dissolve or disperse in water or a mixture of water and a water-soluble solvent by completely or partially neutralizing the carboxyl group and/or phenolic hydroxyl group introduced into the amino acid (c) with various volatile bases such as ammonia and organic amine.

The organic amine used for neutralization is not specifically limited and specific examples thereof include alkylamines such as monomethylamine, dimethylamine, monoethylamine, diethylamine, and triethylamine; hydroxylamines such as N-methylaminoethanol, N,N-dimethylaminoethanol, N,N-diethylaminoethanol, 2-amino-2-methylpropanol, diethanolamine, and triethanolamine; and polyvalent amines such as ethylenediamine and diethylenetriamine. These organic amines may be used alone or in combination, as a matter of course.

In the case of preparing a colored composition containing a coloring material (a) dispersed therein, it is prepared by using at least the coloring material (a) described above and a binder resin in combination with a solvent. Examples of the solvent used in the preparation of the colored composition containing the coloring material (a) dispersed therein include aromatic solvent such as toluene, xylene, or methoxybenzene; acetic acid ester solvent such as ethyl acetate, butyl acetate, propylene glycol monomethyl ether acetate, or propylene glycol monoethyl ether acetate; propionate solvent such as ethoxyethyl propionate; alcohol solvent such as methanol or ethanol; ether solvent such as butylcellosolve, propylene glycol monmethyl ether, diethylene glycol ethyl ether, or diethylene glycol dimethyl ether; ketone solvent such as methyl ethyl ketone, methyl isobutyl ketone, or cyclohexanone; aliphatic hydrocarbon solvent such as hexane; nitrogen compound solvent such as N,N-dimethylformamide, γ-butyrolactam, N-methyl-2-pyrrolidone, aniline, or pyridine; lactone solvent such as y-butyrolactone; carbamic acid ester such as mixture of methyl carbamate and ethyl carbamate in a mixing ratio of 48:52; and water.

These solvents are preferably selected from those having a boiling point of 80 to 200° C. A spin coating method is generally used to form a film of the photocurable colored composition and those having a boiling point of 100 to 170° C. are preferred in view of applicability. These solvents may be used alone or in combination.

In the case of preparing the colored composition by dispersing the coloring material (a), dispersants can be used. The dispersant, which can be used to disperse the coloring material, is not specifically limited, and a conventionally known dispersant can be used. Specific examples thereof include resin type dispersants such as surfactants, pigment intermediates, dye intermediates, polyamide compounds, and polyurethane compounds. Examples of the commercially available product of this resin type dispersant include Disperbyc 130, Disperbyc 161, Disperbyc 162, Disperbyc 163, Disperbyc 170, EFKA 46, EFKA 47, Solsperse 32550, Solsperse 24000, AJISPER PB811, and AJISPER PB814. Acrylic and polyethyelene resin type dispersants can also be used.

If necessary, photopolymerization initiators can also be used in combination with the photocurable colored composition used in the present invention. As the photopolymerization initiator, a photopolymerization initiator capable of generating a radical by dissociation with light can be used. A conventionally known photopolymerization initiator can be used as such a photopolymerization initiator.

Conventionally known photosensitizers can also be used in combination with the photopolymerization initiator. Examples of the photosensitizer used in the present invention include amines, ureas, sulfur containing compounds, phosphorous containing compounds, chlorine containing compounds, nitrites, and other nitrogen containing compounds. These photosensitizers can be used alone or in combination.

The amount is not specifically limited, but is preferably within a range from 0.1 to 30% by weight, and particularly preferably from 1 to 20% by weight, relative to the compound having a photopolmerizable group in the composition. When the amount is less than 0.1% by weight, the sensitivity is lowered. On the other hand, when the amount exceeds 30% by weight, precipitation of crystals and deterioration of physical properties of the coating occurs, and therefore, it is not preferred.

The curable colored composition used in the present invention can be obtained by mixing various components described above. A proper solvent can be used, and the solvent is not specifically limited as long as it does not react with the components described above, and various solvents used in the preparation of the colored composition containing the coloring material (a) dispersed therein can be used. These solvents can be used alone or in combination. In this case, all components may be blended using the same solvent. Alternatively, a solution of the curable colored composition may be prepared by optionally blending various components using different solvents to give two or more solutions and mixing these solutions.

The curable colored composition thus obtained is in a single solution and is superior in storage stability, and is also superior in alkali developing properties of the non-exposed portion during the development, and is capable of easily forming a pattern because an amino resin having a carboxyl group and/or a phenolic hydroxyl group is used. Furthermore, a crosslinked structure is formed by the thermal crosslinking reaction in the baking process after the development process, thereby making it possible to improve the heat resistance and solvent resistance.

If necessary, the curable colored composition used in the present invention may contain other components without departing from the object of the present invention, especially as far as the storage stability, heat resistance and solvent resistance can be maintained. As the other component, conventionally known coupling agents, antioxidants, stabilizers, fillers, and various leveling agents (e.g., silicon, fluorine, and acrylic leveling agents) can be added. Furthermore, polyhydric acids and anhydrides thereof can be added for the purpose of controlling the solubility to alkaline solution and epoxy compounds can be added for the purpose of reduction in a carboxyl group by the reaction.

The coupling agent, which is optionally added to the polymerizable colored resin composition used in the present invention, is a compound which chemically bonds an inorganic material with an organic material, or improves the affinity accompanied with the chemical reaction, thereby enhancing the function of the composite material. Typical coupling agents include, for example, silane compounds, titanium compounds or aluminum compounds.

Among these coupling agents, a silane coupling agent having an epoxy group such as γ-glycidoxypropyltrimethoxysilane or β-(3,4-epoxycyclohexyl)ethyltrimethoxysilane is preferred because it imparts remarkably excellent smoothness, adhesion, water resistance, and solvent resistance to various transparent substrates. These coupling agents may be used alone or in combination.

The amount of these coupling agents is within a range from 0.1 to 30 parts by weight, and preferably from 0.5 to 20 parts by weight, based on 100 parts by weight of the alkali-soluble binder resin. When the amount of the coupling agent is less than 0.1 parts by weight, the smoothness, adhesion with the transparent substrate, water resistance, and solvent resistance of the resulting coating are insufficient. On the other hand, when the amount exceeds 30 parts by weight, an improvement in adhesion cannot be expected and the photocurability of the resulting coating layer is lowered, and therefore, it is not preferred.

Furthermore, epoxy compounds, polyhydric carboxylic acids, and acid anhydrides thereof can be added to the curable colored composition used in the present invention.

Examples of the epoxy compound include phenol-novolak type epoxy resin, cresol-novolak type epoxy resin, bisphenol A type epoxy resin, bisphenol F type epoxy resin, bisphenol novolak type epoxy resin, alicyclic epoxy resin, various glycols, alkylene oxide-modified epoxy resin, glycidyl group containing acrylic resin, and alicyclic epoxy group containing acrylic resin. These epoxy compounds can be used alone or in combination.

Typical examples of the polyhydric carboxylic acid and acid anhydride thereof include aliphatic polyhydric carboxylic acid such as succinic acid, glutaric acid, adipic acid, butanetetracarboxylic acid, maleic acid, or itaconic acid; alicyclic polyhydric carboxylic acid such as hexahydrophthalic acid, 1,2-cyclohexanecarboxylic acid, 1,2,4-cyclohexanetricarboxylic acid, or cyclopentaneteracarboxylic acid; phthalic acid, isophthalic acid, terephthalic acid, trimellitic acid, pyromellitic acid, 1,4,5,8-naphthalenetetracarboxylic acid, or benzophenonetetracarboxylic acid; aliphatic dicarboxylic acid anhydride such as phthalic anhydride, itaconic anhydride, succinic anhydride, citraconic anhydride, dodecylsuccinic anhydride, tricarballylic anhydride, maleic anhydride, hexahydrophthalic anhydride, methyltetrahydrophtalic anhydride, or himic anhydride; aliphatic polyhydric carboxylic acid dianhydride such as 1,2,3,4-butanetetracarboxylic dianhydride or cyclopentanetetracarboxylic dianhydride; pyromellitic anhydride, trimellitic anhydride, or benzophenonetetracarboxylic anhydride; and ester group containing acid anhydride such as ethylene glycol bistrimellitate or glycerin tristrimellitate.

Furthermore, commercially available epoxy resin curing agents made of colorless carboxylic anhydride can also be used preferably. Specific examples thereof include Adeka Hardner EH-700 (trade name, manufactured by Asahi Denka Kogyo), RIKACID-MH and RIKACID MH-700 (manufactured by New Japan Chemical Co., Ltd.), and EPIKINI 126, EPIKINI YH-306 and EPIKINI DX-126 (manufactured by YUKA SHELL EPOXY Co., Ltd.).

Furthermore, as the polyhydric carboxylic acid and anhydride thereof, a resin having two or more carboxyl groups in a molecule or an anhydride thereof can be preferably used. Specific examples thereof include urethane resin, acrylic resin, polyester resin, lactone-modified polyester resin, polyesteramide resin, alkyd resin, polyether resin, modified polyether resin, polythioether resin, polycarbonate resin, polyacetal resin, polyolefin resin, epoxy-modified resin, silicone resin, and fluorine resin, each having a carboxyl group, or acid anhydrides thereof.

The polyhydric carboxylic acids and polyhydric carboxylic anhydrides described above can be used alone or in combination.

The color filter of the present invention can be obtained by coating the resultant curable colored composition used in the present invention to the surface of a transparent substrate, subjecting the coated substrate to a patterning treatment, and heating to cure the curable colored composition, thus forming a pixel for a color filter.

The method of coating the curable colored composition on a transparent substrate used in the present invention is not specifically limited, and various methods can be used such as printing methods, spraying methods, roll coating methods, bar coating methods, curtain coating methods, and spin coating methods.

In the case of being subjected to the patterning treatment of the pixel, the method of forming a coating layer is described below. First, the coating layer of the curable colored composition coated on the transparent substrate is heated (pre-baked). Although the heating conditions vary depending on the kind and amount of the respective components, the heating is carried out at about 50 to 150° C. for about 1 to 15 minutes. Then, the pre-baked coating layer was irradiated with ultraviolet light or visible light via a mask having a predetermined pixel pattern for a color filter, and developed to remove the unnecessary portions, thus forming a predetermined pattern.

A light source used for photocuring is preferably a light source capable of emitting ultraviolet light or visible light, and particularly preferable is a light source for emitting light having a wavelength of 200 to 500 nm. From an economical point of view, ultraviolet light is particularly preferred. Examples of the source capable of emitting ultraviolet light or visible light include low-pressure mercury lamps, medium-pressure mercury lamps, high-pressure mercury lamps, metal halide lamps, chemical lamps, black light lamps, mercury-xenon lamps, eximer lamps, short arc lamps, helium-cadmium lasers, argon lasers, and THG or FHG lasers using Nd-YAG lasers.

Examples of the developer include aqueous solutions of alkalis such as sodium hydroxide, potassium hydroxide, sodium carbonate, sodium silicate, sodium metasilicate, ammonia water, ethylamine, n-propylamine, diethylamine, di-n-propylamine, triethylamine, methyldimethylamine, dimethylethanolamine, diethanolamine, triethanolamine, tetramethylammonium hydroxide, tetraethylammonium hydroxide, tetrabutylammonium hydroxide, pyrrole, piperidine, 1,8-diazabicylo[5,4,0]-7-undecene, and 1,5-diazabiccylo[4,3,0]-5-nonane. It is also possible to use, as the developer, aqueous solutions prepared by adding a proper amount of water-soluble organic solvents such as methanol, ethanol and isopropanol, and surfactants to the aqueous alkaline solutions.

The developing method may be any of paddling method, dipping method, and spraying method. After the development, the unnecessary portion is removed by washing with water and air-drying with compressed air or compressed nitrogen, thus forming a pattern. Then, the resulting pattern is heat-treated at 100 to 280° C. for a predetermined time using a heating apparatus such as a hot plate or oven, thereby making it possible to obtain a coating layer having excellent heat resistance, transparency, and hardness.

The color filter is formed by regularly arranging coloring materials on each pixel to selectively transmit the three primary colors (red, green and blue) of light or to selectively reflect the three primary colors (cyan, magenta and yellow) of color, on a transparent substrate provided with a black matrix.

According to the curable colored composition used in the present invention, it becomes possible to form colored pixel of the three primary colors (red, green and blue) or the three primary colors (cyan, magenta and yellow) and black used for light shielding by repeatedly carrying out coating process, exposure process, development process, and baking process of the curable colored composition on the substrate, for each of different colors. The color filter having excellent heat resistance, solvent resistance, and chemical resistance can be produced by using the curable colored composition described above.

EXAMPLES

The present invention will be described in detail by way of the following Examples, but the present invention is not limited by the Examples. In the following Examples, parts and percentages are by weight unless otherwise indicated. Performance tests of the resulting coatings were carried out by the following procedures.

Performance Test and Evaluation Criteria

Storage stability: The viscosity was measured after a red pigment dispersion was stored at 40° C. for 24 hours. Test samples where a change in viscosity relative to an initial viscosity is smaller than 10% were rated "good (◯)", while test samples where a change in viscosity relative to an initial viscosity is larger than 10% were rated "poor (X)". The viscosity was measured by using an E-type viscometer manufactured by TOKIMEC INC.

Developing characteristics: After spin-coating at 1000 m$^{-1}$ for nine seconds using a spin coater and pre-baking at 60° C. for five minutes, the coating layer having a thickness of 1.5 μm was exposed to light from a medium-pressure mercury lamp at a dose of 1000 J/m$^2$ using a predetermined pattern mask, and was then developed with an alkaline developer maintained at 30° C. As the developer, a developer (pH 10.82) prepared by 30-fold dilution of ID19A1 (tetramethylammonium hydroxide based developer, manufactured by ITES Co, Ltd.) with pure water was used. After the development, the product was further washed with pure water. It was evaluated by these operations whether or not a pattern (which is to remain) having a linear width of 50 μm can be carried out. Test samples where patterning can be carried out were rated "good (◯)", while test samples where patterning cannot be carried out were rated "poor (X)".

After-baking: With respect to the coating film obtained after developing wherein evaluation results of developing characteristics are good (◯), after-baking was carried out at 230° C. for 15 minutes.

Heat resistance 1: The coating film obtained by coating on the glass substrate and curing was done by heating at 280° C. for 30 minutes and the heat resistance 1 was evaluated by a change of the transparency (Y value) in color hue before and after heating. Test samples where the difference ΔY in Y value is smaller than 0.5 were rated "good (◯)", while test samples where the difference ΔY in Y value is larger than 0.5 were rated "poor (X)". The chromaticity was measured by a microscopic spectrophotometer OSP-SP200 manufactured by OLYMPUS OPTICAL CO., LTD.

Heat resistance 2: The coating film obtained by coating on the glass substrate and curing was done by heating at 280° C. for 30 minutes and the heat resistance 2 was evaluated by a change of the maximum light transmittance before and after heating. Test samples where the change in maximum light transmittance relative to an initial maximum light transmittance (ΔY) is smaller than 5% were rated "good (◯)", while test samples where ΔY is larger than 5% were rated "poor (X)".

Chemical resistance 1: The cured coating film was dipped in N-methyl-2-pyrrolidone at 23° C. for 30 minutes and the boundary surface of the dipped portion was observed. Test samples where the boundary line cannot be visually confirmed were rated "good (◯)", while test samples where the boundary line can be visually confirmed were rated "poor (X)".

Chemical resistance 2: The cured coating film was rubbed with acetone at 25° C. under a load of 100 g using a rubbing tester (manufactured by Taihei Rika Kogyo Co., Ltd.) and the number of rubbings required to expose the glass substrate as a base was determined. Test samples where the number of rubbings is less than 25 were rated "poor (X)", test samples where the number of rubbings is not less than 25 and is less than 100 were rated "good (◯)", and test samples where the number of rubbings is not less than 100 were rated "excellent (◎)".

Preparation Example 1

Preparation of Amino Resin Having Carboxyl Group

In a four-necked flask equipped with a thermometer, a reflux condenser and a stirrer, 131.7 parts of 2-(4,6-diamino-1,3,5-triazin-2-yl)benzoic acid containing 12.3 parts of water, 202.8 parts of an aqueous 37% formaldehyde solution and 222.3 parts of n-butanol were charged, and then the four-necked flask was dipped in an oil bath heated previously to 115° C. with stirring. After 15 minutes, the mixture became a uniform solution and reflux was initiated. After the reaction was continued for two hours, water and excess formaldehyde were distilled off under reduced pressure of 5.33×10$^4$ Pa over three hours.

After water and n-butanol were distilled off, propylene glycol monomethyl ether acetate (hereinafter abbreviated to PGMAc) was added and the mixture was cooled. PGMAc was further added and the nonvolatile content (% by weight of residual resin after drying at 107.5° C. for one hour) was adjusted to 40.0. As a result, an amino resin (A-1) having a carboxyl group, wherein an acid value (the number of milligrams of potassium hydroxide required to neutralize an acid content in 1 g of a sample according to a defined method) of the resin solid content is 94.6 mg KOH/g, was obtained. The number-average molecular weight Mn calculated in terms of polystyrene was 2150 and the molecular weight distribution Mw/Mn was 5.12.

Preparation Example 2

Preparation of Amino Resin Having Carboxyl Group

In a four-necked flask equipped with a thermometer, a reflux condenser and a stirrer, 37.4 parts benzoguanamine, 118.4 parts of an aqueous 50% glyoxylic acid solution and 88.8 parts of n-butanol were charged, and then the four-necked flask was dipped in an oil bath heated previously to 115° C. with stirring. After 15 minutes, the mixture became a uniform solution and reflux was initiated. After the reaction was continued for one hour, water and excess formaldehyde were distilled off under reduced pressure of 5.33×10$^4$ Pa over four hours. After water and n-butanol were distilled off, PGMAc was added and the mixture was cooled. The PGMAc was further added and the nonvolatile content was adjusted to 40.0. As a result, an amino resin (A-2) having a carboxyl group, wherein an acid value of the resin solid content is 36 mg KOH/g, was obtained. The number-average molecular weight Mn calculated in terms of polystyrene was 1624 and the molecular weight distribution Mw/Mn was 1.28.

Preparation Example 3

Preparation of Amino Resin Having Phenolic Hydroxyl Group

In a four-necked flask equipped with a thermometer, a reflux condenser and a stirrer, 18.7 parts benzoguanamine, 48.8 parts of p-hydroxybenzaldehyde and 88.8 parts of n-butanol were charged, and then the four-necked flask was dipped in an oil bath heated previously to 125° C. with stirring. After 20 minutes, the mixture became a uniform solution and reflux was initiated. The reaction was continued at the same temperature for 24 hours. After the completion of the reaction, water and excess formaldehyde were distilled off under reduced pressure of 5.33×10$^4$ Pa and the resulting solid was washed with a mixed solution of n-hexane and ethyl acetate in a mixing ratio of 2:1 to remove excess p-hydroxybenzaldehyde. PGMAc was added and the mixture was cooled and PGMAc was further added, and then the nonvolatile content was adjusted to 40.0. As a result, an amino resin (A-3) having a phenolic hydroxyl group, wherein an acid value of the resin solid content is 85.2 mg KOH/g, was obtained. The number-average molecular weight Mn calculated in terms of polystyrene was 4000 and the molecular weight distribution Mw/Mn was 3.26.

Preparation Example 4

Preparation of Acrylic Resin Having Carboxyl Group

In a four-necked flask equipped with a thermometer, a reflux condenser, a stirrer and a nitrogen gas introducing inlet, 425.0 parts of PGMAc was charged and, after heating to 90° C. with stirring, a mixture of 42.8 parts of methacrylic acid (hereinafter abbreviated to MAA), 286.1 parts of benzyl methacrylate (hereinafter abbreviated to BZMA), 96.0 parts of PGMAc and 16.5 parts of t-butylperoxy-2-ethyl hexanoate (hereinafter abbreviated to P-O) was added dropwise over one hour. After the completion of the dropwise addition, the mixture was maintained at 90° C. for two hours and 1.7 parts of P-O was added. Furthermore, the reaction was carried out at the same temperature for seven hours to obtain an acrylic resin (A-4) solution having a carboxyl group, wherein an acid value of the resin solid content is 84.0 mg KOH/g, was obtained. The nonvolatile content of the resulting resin solution was 39.7%, the number-average molecular weight Mn calculated in terms of polystyrene was 9500, and the molecular weight distribution Mw/Mn was 2.07.

Example 1

Using a high-speed dispersing machine "TSG-6H" (manufactured by Igarashi Kikai Seizo) containing 0.5 mm diameter zirconia beads charged therein, a dispersion consisting of 25.0 parts of an amino resin solution (A-1) having a carboxyl group prepared in Preparation Example 1, 8.0 parts of Pigment Red 254, 2.5 parts of AJISPER PB814 and 64.5 parts of PGMAc was dispersed at a revolution rate of 2000 m$^{-1}$ for eight hours to obtain a red pigment dispersion (D-1). Then, 7.0 parts of dipentaerythritol hexaacrylate (hereinafter abbreviated to DPHA) and 0.3 parts of Irgacure #369 were added to 100 parts of the red pigment dispersion (D-1) and, after mixing them, the mixture was filtered through a filter having a pore diameter of 1.0 μm to obtain a photocurable colored composition (R-1).

25 g of the resulting photocurable colored composition (R-1) was transferred to a glass container and was stored at 40° C. for 24 hours after sealing. According to the procedure of the performance test, the storage stability was evaluated. As a result, the storage stability was good.

Then, a glass substrate was spin-coated with the photocurable colored composition (R-1) by using a spin coater at a revolution rate of 1000 m$^{-1}$ for nine seconds and was then pre-baked at 60° C. for five minutes to form a coating layer. The resulting coating layer was exposed to light from a medium-pressure mercury lamp at a dose of 1000 J/m$^2$ via a predetermined pattern mask. The resulting coating was evaluated according to items of the performance test.

The evaluation results are shown in Table 1.

TABLE 1

| | Example 1 | Example 2 | Example 3 | Example 4 | Example 5 | Example 6 | Comp. Example 1 |
|---|---|---|---|---|---|---|---|
| Composition of photopolymerizable colored composition | | | | | | | |
| Amino resin solution | A-1 25.0 | A-2 25.0 | A-3 25.0 | A-1 12.5 | A-1 25.0 | A-1 25.0 | — |
| Acrylic resin solution | — | — | — | A-4 12.5 | — | — | A-4 25.0 |
| Red pigment dispersion | 100 | 100 | 100 | 100 | 100 | 100 | 100 |
| Photopolymerizable monomer | DPHA 7.0 | DPHA 7.0 | DPHA 7.0 | DPHA 7.0 | PETA 7.0 | MIA250 7.0 | DPHA 7.0 |
| Irg-#369 | 0.3 | 0.3 | 0.3 | 0.3 | 0.3 | 0.3 | 0.3 |
| Performances of coating film | | | | | | | |
| Storage stability | ◯ | ◯ | ◯ | ◯ | ◯ | ◯ | ◯ |
| Developing characteristics | ◯ | ◯ | ◯ | ◯ | ◯ | ◯ | ◯ |
| Heat resistance test 1 | ◎ | ◯ | ◯ | ◎ | ◎ | ◎ | X |
| Heat resistance test 2 | ◎ | ◯ | ◯ | ◎ | ◎ | ◎ | X |
| Appearance of coating film after heat resistance test | good | good | good | good | good | good | slightly uneven surface |
| Chemical resistance test 1 | ◯ | ◯ | ◯ | ◯ | ◯ | ◯ | ◯ |
| Chemical resistance test 2 | ◯ | ◯ | ◯ | ◯ | ◯ | ◯ | X |

Note:
Units of all numbers in the table are parts by weight.
DPHA: dipentaerythritol hexaacrylate
PETA: pentaerythritol triacrylate
MIA250: poly(tetramethylene glycol) bis(maleimide acetate) (average molecular weight of poly(tetramethylene glycol): 250)
Irg #369: Irgacure #369

As a result, a color pattern for a color filter having excellent developing characteristics, heat resistance, and chemical resistance were obtained.

The absorption spectrum and thin-film X-ray diffraction of the coating layer after the heat resistance test were measured. As a result, a change in crystal form and an increase in crystal size of the red pigment were not observed.

Example 2

In the same manner as in Example 1, except that the amino resin (A-1) used in Example 1 was replaced by an amino resin (A-2) obtained in Preparation Example 2, a photocurable colored composition (R-2) was obtained.

25 g of the resulting photocurable colored composition (R-2) was transferred to a glass container and was stored at 40° C. for 24 hours after sealing, and the storage stability was evaluated. As a result, the storage stability was good.

Then, a glass substrate was spin-coated with the photocurable colored composition (R-2) to form a coating layer in the same manner as in Example 1. In the same manner as in Example 1, the exposure, development and cleaning processes were carried out and the resulting coating was evaluated according to items of the performance test.

The evaluation results are shown in Table 1.

As a result, a color pattern for a color filter having excellent developing characteristics, heat resistance, and chemical resistance were obtained.

The absorption spectrum and thin-film X-ray diffraction of the coating layer after the heat resistance test were measured. As a result, a change in crystal form and an increase in crystal size of the red pigment were not observed.

Example 3

In the same manner as in Example 1, except that the amino resin (A-1) used in Example 1 was replaced by an amino resin (A-3) obtained in Preparation Example 3, a photocurable colored composition (R-3) was obtained.

25 g of the resulting photocurable colored composition (R-3) was transferred to a glass container and was stored at 40° C. for 24 hours after sealing, and the storage stability was evaluated. As a result, the storage stability was good.

Then, a glass substrate was spin-coated with the photocurable colored composition (R-3) to form a coating layer in the same manner as in Example 1. In the same manner as in Example 1, the exposure, development and cleaning processes were carried out and the resulting coating film was evaluated according to items of the performance test.

The evaluation results are shown in Table 1.

As a result, a color pattern for a color filter having excellent developing characteristics, heat resistance, and chemical resistance were obtained.

The absorption spectrum and thin-film X-ray diffraction of the coating layer after the heat resistance test were measured. As a result, a change in crystal form and an increase in crystal size of the red pigment were not observed.

Example 4

In the same manner as in Example 1, except that 25 parts of the amino resin (A-1) used in Example 1 was replaced by a mixture of 12.5 parts of an amino resin (A-1) obtained in Preparation Example 1 and 12.5 parts of an acrylic resin (A-4) obtained in Preparation Example 4, a photocurable colored composition (R-4) was obtained. In the same manner as in Example 1, the storage stability and various physical properties of the coating were evaluated. The evaluation results are shown in Table 1.

As a result, the storage stability of the composition was good and a color pattern for a color filter having excellent developing characteristics, heat resistance, and chemical resistance were obtained.

The absorption spectrum and thin-film X-ray diffraction of the coating layer after the heat resistance test were measured. As a result, a change in crystal form and an increase in crystal size of the red pigment were not observed.

Example 5

In the same manner as in Example 1, except that the photocurable resin DPHA used in Example 1 was replaced by pentaerythritol triacrylate (hereinafter abbreviated to PETA), a photocurable colored composition (R-5) was obtained. In the same manner as in Example 1, the storage stability and various physical properties of the coating were evaluated. The evaluation results are shown in Table 1.

As a result, the storage stability of the composition was good and a color pattern for a color filter having excellent developing characteristics, heat resistance, and chemical resistance were obtained.

The absorption spectrum and thin-film X-ray diffraction of the coating layer after the heat resistance test were measured. As a result, a change in crystal form and an increase in crystal size of the red pigment were not observed.

Example 6

In the same manner as in Example 1, except that the photocurable resin DPHA used in Example 1 was replaced by poly(tetramethylene glycol) bis(maleimide acetate) (average molecular weight of poly(tetramethylene glycol): 250) (hereinafter abbreviated to MIA250), a photocurable colored composition (R-6) was obtained. In the same manner as in Example 1, the storage stability and various physical properties of the coating layer were evaluated. The evaluation results are shown in Table 1.

As a result, the storage stability of the composition was good and a color pattern for a color filter having excellent developing characteristics, heat resistance, and chemical resistance were obtained.

The absorption spectrum and thin-film X-ray diffraction of the coating layer after the heat resistance test were measured. As a result, a change in crystal form and an increase in crystal size of the red pigment were not observed.

Comparative Example 1

In the same manner as in Example 1, except that the amino resin (A-1) used in Example 1 was replaced by an acrylic resin (A-4) obtained in Preparation Example 4, a photocurable colored composition (R-7) was obtained. In the same manner as in Example 1, the storage stability and various physical properties of the coating were evaluated. The evaluation results are shown in Table 1.

As a result, the storage stability was good, but the resulting coating had poor heat resistance and chemical resistance.

The absorption spectrum and thin-film X-ray diffraction of the coating film after the heat resistance test were measured. As a result, it was confirmed that the crystal size of the red pigment increased.

It is apparent that, when using only an acrylic resin as the binder resin, the resulting coating is inferior in heat resistance and chemical resistance to Examples 1 to 6.

What is claimed is:

1. A color filter comprising a transparent substrate and a pixel formed on said transparent substrate, wherein said pixel is made of a coating layer of a curable colored composition containing (a) a coloring material, (b) a compound having a photopolymerizable functional group and (c) an amino resin having a carboxyl group and/or a phenolic hydroxyl group and said coating is photocured and then heat-cured.

2. The color filter according to claim 1, wherein said amino resin (c) having a carboxyl group and/or a phenolic hydroxyl group is an amino resin obtained by condensing (c-1) (4,6-diamino-1,3,5-triazin-2-yl)benzoic acid with (c-2) at least one aldehyde compound selected from the group consisting of formaldehyde, glyoxylic acid, succinsemialdehyde and hydroxybenzaldehyde.

3. The color filter according to claim 1, wherein said amino resin (c) having a carboxyl group and/or a phenolic hydroxyl group is an amino resin obtained by condensing (c-3) at least one triazine compound selected from the group consisting of melamine, benzoguanamine and (4,6-diamino-1,3,5-triazin-2-yl)benzoic acid with (c-4) at least one aldehyde compound selected from the group consisting of glyoxylic acid, succinsemialdehyde and hydroxybenzaldehyde.

4. The color filter according to claim 1, wherein said compound (b) having a photopolymerizable functional group is a (meth)acrylic acid derivative and/or a maleimide derivative.

5. A method for producing a color filter, which comprises forming a coating layer on a transparent substrate using a curable colored composition containing (a) a coloring material, (b) a compound having a photopolymerizable functional group and (c) an amino resin having a carboxyl group and/or a phenolic hydroxyl group, exposing said coating layer to light via a mask having a pixel pattern for a color filter, thereby curing said coating film, developing said coating film to form a pixel, and heating said pixel, thereby heat-curing said pixel.

6. The method for producing a color filter according to claim 5, wherein said amino resin (c) having a carboxyl group and/or a phenolic hydroxyl group is an amino resin obtained by condensing (c-1) (4,6-diamino-1,3,5-triazin-2-yl)benzoic acid with (c-2) at least one aldehyde compound selected from the group consisting of formaldehyde, glyoxylic acid, succinsemialdehyde and hydroxybenzaldehyde.

7. The method for producing a color filter according to claim 5, wherein said amino resin (c) having a carboxyl group and/or a phenolic hydroxyl group is an amino resin obtained by condensing (c-3) at least one triazine compound selected from the group consisting of melamine, benzoguanamine and (4,6-diamino-1,3,5-triazin-2-yl)benzoic acid with (c-4) at least one aldehyde compound selected from the group consisting of glyoxylic acid, succinsemialdehyde and hydroxybenzaldehyde.

8. The method for producing a color filter according to claim 5, wherein said compound (b) having a photopolymerizable functional group is a (meth)acrylic acid derivative and/or a maleimide derivative.

* * * * *